(12) United States Patent
Soucy

(10) Patent No.: US 12,452,993 B1
(45) Date of Patent: Oct. 21, 2025

(54) PASSIVE NOISELESS SHUNT ASSEMBLY

(71) Applicant: Jeremiah Cech Soucy, Mesa, AZ (US)

(72) Inventor: Jeremiah Cech Soucy, Mesa, AZ (US)

( * ) Notice: Subject to any disclaimer, the term of this patent is extended or adjusted under 35 U.S.C. 154(b) by 410 days.

(21) Appl. No.: 18/091,256

(22) Filed: Dec. 29, 2022

(51) Int. Cl.
*H05K 1/02* (2006.01)
*H01H 13/14* (2006.01)

(52) U.S. Cl.
CPC ........... *H05K 1/0215* (2013.01); *H01H 13/14* (2013.01); *H05K 2201/10287* (2013.01)

(58) Field of Classification Search
CPC ...... H01H 3/125; H01H 13/705; H01H 13/14; H01H 13/04; H01H 13/10; H01H 13/70; H01H 13/704; H01H 13/7065; H01H 13/7006; H01H 13/7057; H01H 13/78; H01H 13/79; H01H 13/52; H01H 13/703; H01H 13/507; H01H 3/12; H01H 13/20; H05K 1/0215; H05K 1/0216
See application file for complete search history.

(56) References Cited

U.S. PATENT DOCUMENTS

| | | | |
|---|---|---|---|
| 8,385,845 B1* | 2/2013 | Cortese | H04B 1/48 455/78 |
| 10,779,395 B1* | 9/2020 | Harrigan | H03H 7/38 |
| 2016/0124574 A1* | 5/2016 | Rouaissia | H01Q 1/243 345/174 |
| 2018/0234080 A1* | 8/2018 | Shrivastava | H03H 11/28 |

* cited by examiner

Primary Examiner — Ahmed M Saeed
(74) Attorney, Agent, or Firm — Plager Schack LLP; Mark H. Plager; Michael O'Brien

(57) ABSTRACT

An audio kill switch provides a noiseless passive cessation of an audio signal. A printed circuit board is joined to an upper shell and has a plurality of interlaced three mil copper signal and ground traces from a center signal trace and outer grounding ring respectively, with three mil spaces between traces interlaced in a way to gradually shunt the signal to ground over several milliseconds when contact between them is made by the conductive rubber button. A target pad is arranged on the center of the printed circuit board. An outer shell is surrounding the printed circuit board. A conductive rubber button is joined to a spring. A nylon outer sleeve is arranged against the conductive rubber button. A spring-loaded connector is arranged against the target pad and joined to a rubber sleeve.

3 Claims, 4 Drawing Sheets

PASSIVE NOISELESS SHUNT ASSEMBLY

RELATED APPLICATION

This application claims priority to provisional U.S. patent application Ser. No. 63/294,750 filed on Dec. 29, 2021, the entire contents of which is herein incorporated by reference.

BACKGROUND

The embodiments herein relate generally to passive audio circuits and related equipment.

Prior to embodiments of the disclosed invention, an audible popping sound occurred in live and recorded audio applications when attempting to "kill" an audio signal by shunting an audio signal to ground using a passive circuit, and using traditional mechanical on/off switches that utilize metal to metal contacts. Embodiments of the disclosed invention solve this problem.

SUMMARY

An on/off audio "kill" switch provides a noiseless cessation of an audio signal, by shunting the signal to ground incrementally. A printed circuit board containing a grounding ring on the bottom is joined to a lower metal housing, using a plurality of interlaced three mil copper traces from a center signal trace on top and outer grounding ring on bottom respectively, with three mil spaces between traces. The three mil signal and ground traces are interlaced in a way to gradually shunt the signal to ground over several milliseconds, as downward pressure is applied to the conductive rubber button. A target pad is arranged on the center bottom of the printed circuit board in order to carry signal to the circuit board. A lower metal housing is surrounding the printed circuit board in order to carry ground to the circuit. A carbon impregnated conductive rubber button is joined to a spring, in order to apply back tension and keep the switch in the off position until engaged by the end user. An upper nylon sleeve is arranged against the conductive rubber button, spring, and the outer housing to shield the button from a constant ground connection. A spring-loaded connector is arranged against the target pad and joined to a rubber sleeve. Engaging the button using downward pressure causes the conductive rubber button to engage the plurality of interlaced three mil copper signal and ground traces in order to shunt signal to ground incrementally over several milliseconds, thereby causing cessation of the audio signal without producing unwanted noise.

BRIEF DESCRIPTION OF THE FIGURES

The detailed description of some embodiments of the invention is made below with reference to the accompanying figures, wherein like numerals represent corresponding parts of the figures.

DETAILED DESCRIPTION OF CERTAIN EMBODIMENTS

Figure 1:
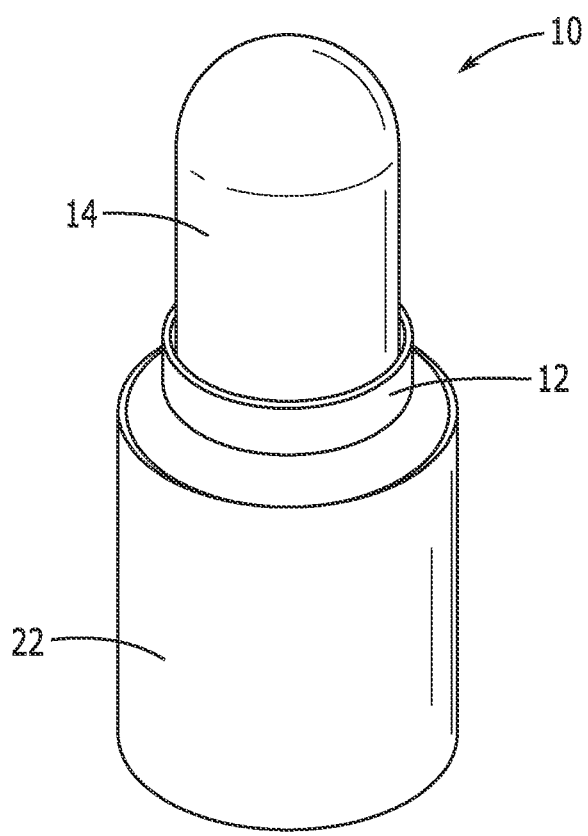
FIG. 1 shows a detail perspective view of one embodiment of the present invention.
Figure 2:
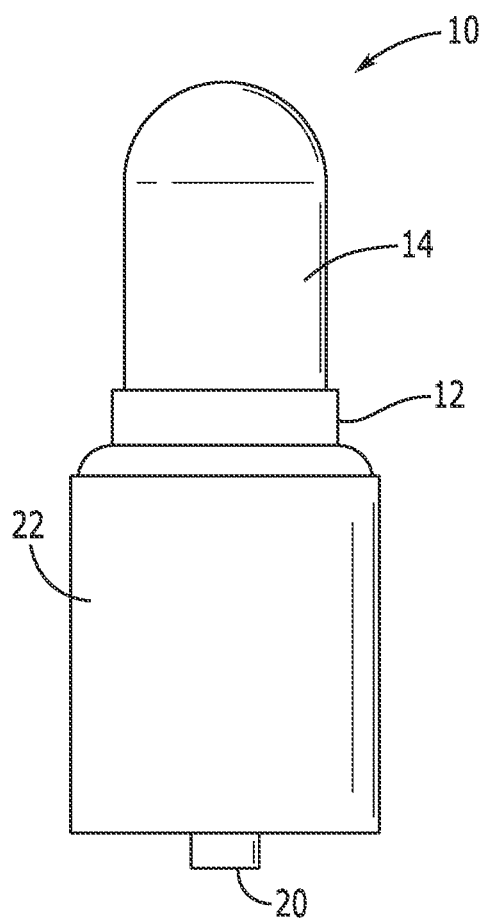
FIG. 2 shows a side elevation view of one embodiment of the present invention.
Figure 3:
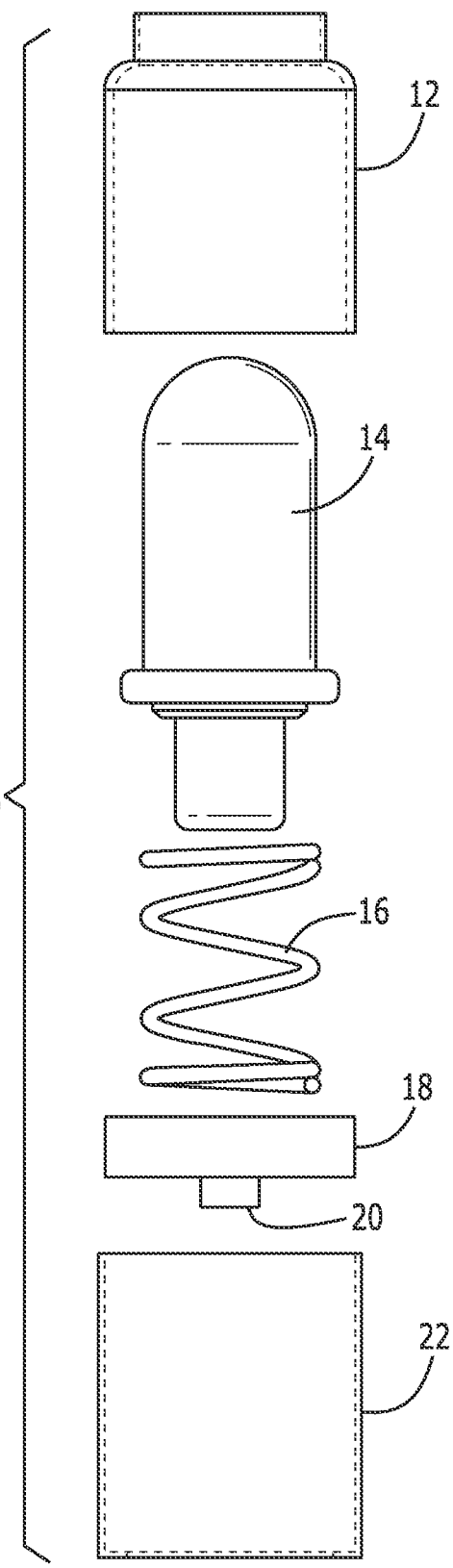
FIG. 3 shows an exploded side elevation view of one embodiment of the present invention.
Figure 4:
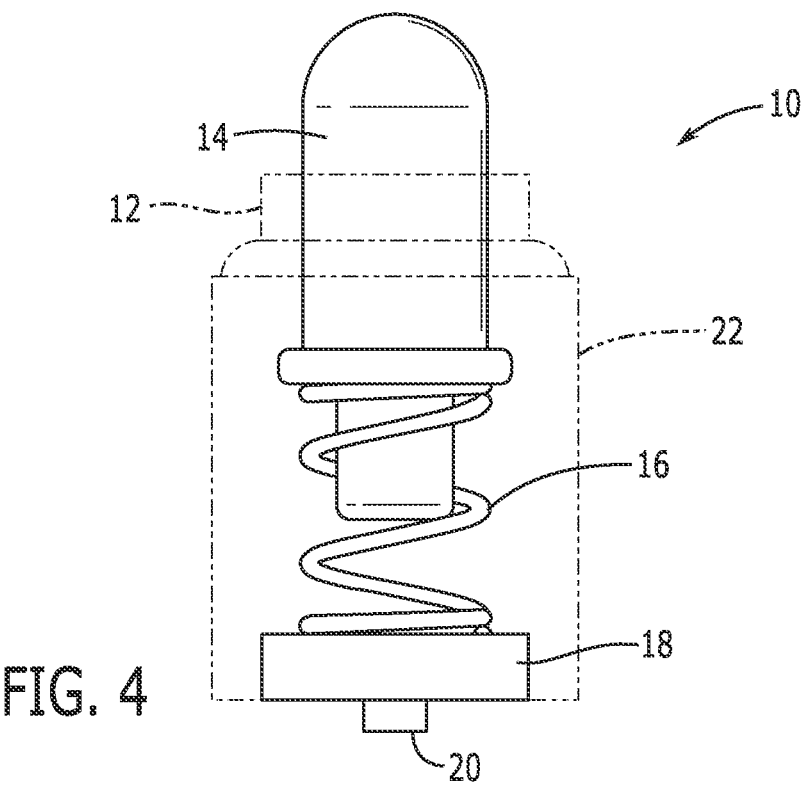
FIG. 4 shows a side elevation view of one embodiment of the present invention in a non-activated mode.
Figure 5:
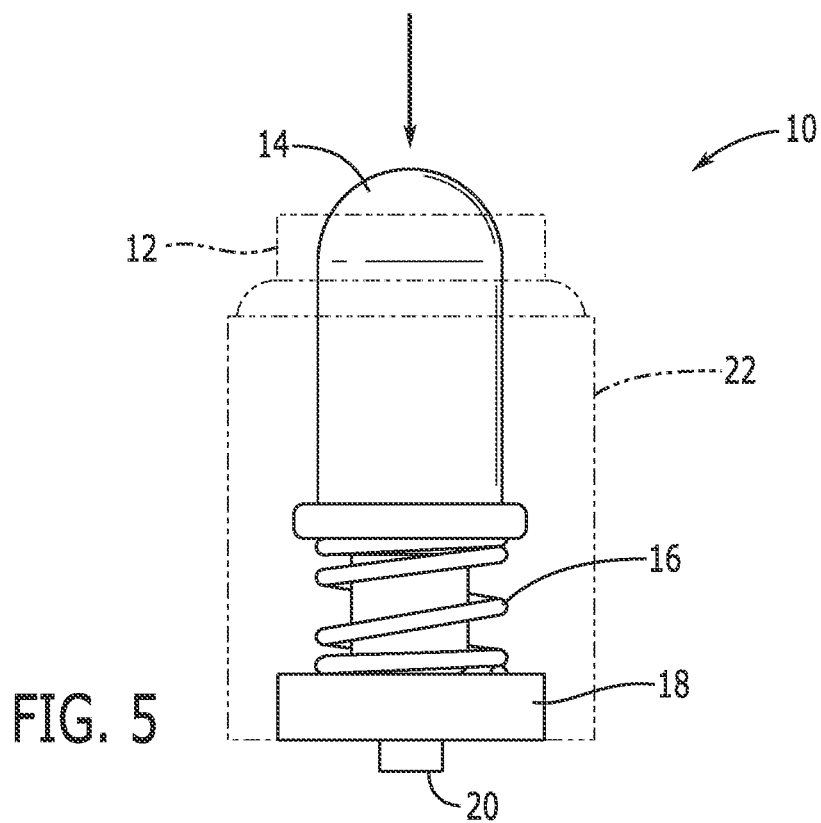
FIG. 5 shows a side elevation view of one embodiment of the present invention in an activated mode.

By way of example, and referring to FIG. 1-5, one embodiment of a passive noiseless shunt assembly 10 comprises a top outer sleeve 12. A conductive rubber button 14 is arranged through a central opening in the top outer sleeve 12. A spring 16 is arranged adjacent to the rubber button 14 and a printed circuit board 18. A mounted target pad 20 is joined to the printed circuit board 18. A bottom outer sleeve 22 fits around the top outer sleeve 12.

Figure 6:
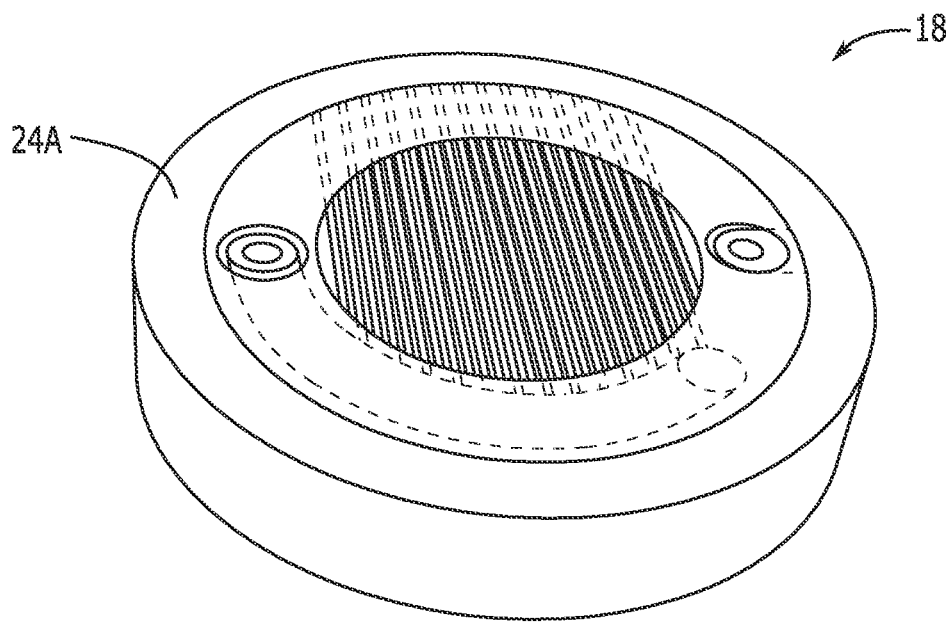
FIG. 6 shows a top perspective view of one embodiment of the printed circuit board of the present invention.
Figure 7:
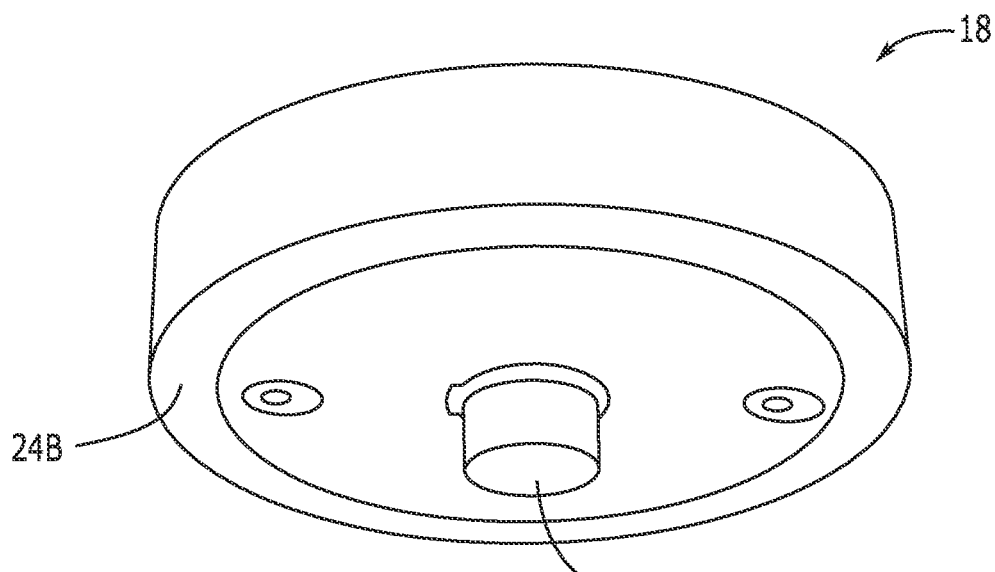
FIG. 7 shows a bottom perspective view of one embodiment of the printed circuit board of the present invention.

Turning to FIGS. 6-7, in some embodiments, printed circuit board 18 further comprises a top grounding ring 24A joined to a bottom grounding ring 24B around the printed circuit board in order to protect the printed circuit board.

One embodiment of an audio "kill" switch provides a noiseless passive elimination of a passive audio signal. A printed circuit board is joined to a metal lower shell and has a plurality of three mil copper traces from a center signal trace and outer grounding ring respectively, with three mil spaces between traces interlaced to gradually shunt the signal to ground over several milliseconds. A target pad is arranged on the center of the printed circuit board to carry signal to the circuit board via a spring loaded connector. An outer shell is surrounding the printed circuit board. A conductive rubber button is joined to a spring. A nylon outer sleeve is arranged against the conductive rubber button and is joined to the metal lower housing. A spring-loaded connector is arranged against the target pad and joined to a rubber sleeve. Applying downward pressure on the conductive rubber button causes the plurality of interlaced three mil copper signal and ground traces to shunt the signal to ground without creating unwanted noise.

Embodiments of the disclosed invention provide a passive audio "kill" switch that does not create undesirable audible noise in live music performances and/or music recording. This involves eliminating the direct metal on metal contact commonly used to make contact between two points. A conductive rubber button makes contact with the signal and ground traces incrementally on a printed circuit board in order to attain the desired result. The conductive rubber button enables the end user to engage the assembly by applying downward force until the lower part of the button makes contact with the circuit board. The lower housing partially houses the assembly and makes direct contact with printed circuit board to create the environment, that allows the assembly to create an electrical ground with the "outer assembly". The spring allows for the circuit to return to an "always off" position when not engaged by the user. The upper nylon housing partially houses the assembly, and prevents the conductive rubber button from creating a constant ground connection to the metal spring or to the metal cap.

As used in this application, the term "a" or "an" means "at least one" or "one or more."

As used in this application, the term "about" or "approximately" refers to a range of values within plus or minus 10% of the specified number.

As used in this application, the term "substantially" means that the actual value is within about 10% of the actual desired value, particularly within about 5% of the actual desired value and especially within about 1% of the actual desired value of any variable, element or limit set forth herein.

All references throughout this application, for example patent documents including issued or granted patents or equivalents, patent application publications, and non-patent literature documents or other source material, are hereby incorporated by reference herein in their entireties, as though individually incorporated by reference, to the extent each reference is at least partially not inconsistent with the disclosure in the present application (for example, a reference that is partially inconsistent is incorporated by reference except for the partially inconsistent portion of the reference).

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

Any element in a claim that does not explicitly state "means for" performing a specified function, or "step for" performing a specified function, is not to be interpreted as a "means" or "step" clause as specified in 35 U.S.C. § 112, ¶ 6. In particular, any use of "step of" in the claims is not intended to invoke the provision of 35 U.S.C. § 112, ¶ 6.

Persons of ordinary skill in the art may appreciate that numerous design configurations may be possible to enjoy the functional benefits of the inventive systems. Thus, given the wide variety of configurations and arrangements of embodiments of the present invention the scope of the invention is reflected by the breadth of the claims below rather than narrowed by the embodiments described above.

What is claimed is:

1. A passive noiseless shunt assembly, configured to provide a noiseless cessation of a signal in a passive environment; the passive noiseless shunt assembly comprising:
   a conductive rubber button, arranged through a central opening in a top outer sleeve;
   a spring, arranged adjacent to the conductive rubber button and a printed circuit board;
   a mounted target pad, joined to the printed circuit board;
   a bottom outer sleeve, fit around the top outer sleeve; and
   wherein the printed circuit board is configured to gradually shunt the signal to ground over several milliseconds.

2. The passive noiseless shunt assembly of claim 1, wherein the printed circuit board is joined to an upper shell and further comprising: a plurality of three mil copper traces from a center signal trace and outer grounding ring respectively, with three mil spaces between traces interlaced.

3. The passive noiseless shunt assembly of claim 2, wherein engaging the button by pressing downward causes the plurality of interlaced three mil copper ground and signal traces to connect signal to ground gradually, causing the audible signal to cease, without generating unwanted noise.

* * * * *